United States Patent
Naser-Ghodsi et al.

(10) Patent No.: US 7,709,792 B2
(45) Date of Patent: May 4, 2010

(54) THREE-DIMENSIONAL IMAGING USING ELECTRON BEAM ACTIVATED CHEMICAL ETCH

(75) Inventors: Mehran Naser-Ghodsi, Hamilton, MA (US); Tzu-Chin Chuang, Cupertino, CA (US); Kenneth Krzeczowski, Scotts Valley, CA (US); Matthew Lent, Livermore, CA (US); Chris Huang, Cupertino, CA (US); Stanislaw Marek Borowicz, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 344 days.

(21) Appl. No.: 11/622,758

(22) Filed: Jan. 12, 2007

(65) Prior Publication Data

US 2007/0158562 A1    Jul. 12, 2007

Related U.S. Application Data

(60) Provisional application No. 60/758,818, filed on Jan. 12, 2006, provisional application No. 60/829,643, filed on Oct. 16, 2006, provisional application No. 60/829,636, filed on Oct. 16, 2006, provisional application No. 60/829,659, filed on Oct. 16, 2006.

(51) Int. Cl.
*H01J 37/28* (2006.01)
*H01J 37/305* (2006.01)
*G01N 23/225* (2006.01)

(52) U.S. Cl. ............ 250/310; 250/492.2; 250/307

(58) Field of Classification Search ............ None
See application file for complete search history.

(56) References Cited

U.S. PATENT DOCUMENTS

| 4,622,095 A | 11/1986 | Grobman et al. |
| 4,897,552 A | 1/1990 | Okunuki et al. |
| 5,188,706 A | 2/1993 | Hori et al. ............ 216/12 |

(Continued)

FOREIGN PATENT DOCUMENTS

JP    01105539 A    4/1989

OTHER PUBLICATIONS

"Central processing unit." Encyclopædia Britannica. 2009. Encyclopædia Britannica Online. Aug. 10, 2009 <http://www.search.eb.com/eb/article-9022087>.*

(Continued)

*Primary Examiner*—Jack I Berman
(74) *Attorney, Agent, or Firm*—Joshua D. Isenberg; JDI Patent

(57) ABSTRACT

Methods and apparatus for imaging a structure and a related processor-readable medium are disclosed. A surface of a substrate (or a portion thereof) is exposed to a gas composition. The gas composition includes one or more components that etch the substrate upon activation by interaction with a beam of electrons. A beam of electrons is directed to one or more portions of the surface of the substrate that are exposed to the gas composition to etch the one or more portions. A plurality of images is obtained of the one or more portions at different instances of time as the one or more portions are etched. A three-dimensional model of one or more structures embedded within the one or more portions of the substrate is generated from the plurality of images.

21 Claims, 3 Drawing Sheets

U.S. PATENT DOCUMENTS

| | | | |
|---|---|---|---|
| 5,686,171 | A | 11/1997 | Vokoun et al. ............... 428/209 |
| 6,027,842 | A | 2/2000 | Ausschnitt et al. |
| 6,753,538 | B2 | 6/2004 | Musil et al. ............... 250/492.2 |
| 6,843,927 | B2 | 1/2005 | Naser-Ghodsi ............... 216/84 |
| 6,943,350 | B2 | 9/2005 | Nasser-Ghodsi et al. .... 250/310 |
| 7,148,073 | B1 | 12/2006 | Soltz et al. |
| 7,312,448 | B2 * | 12/2007 | Principe ..................... 250/310 |
| 7,348,556 | B2 * | 3/2008 | Chitturi et al. ............... 250/309 |
| 2003/0047691 | A1 | 3/2003 | Musil et al. |
| 2004/0013858 | A1 | 1/2004 | Hacker et al. ............ 428/195.1 |
| 2004/0033425 | A1 | 2/2004 | Koops et al. |
| 2004/0041095 | A1 | 3/2004 | Nasser-Ghodsi et al. |
| 2004/0266200 | A1 | 12/2004 | Schaller et al. ............. 438/705 |
| 2006/0000802 | A1 | 1/2006 | Kumar et al. .................. 216/67 |
| 2007/0158303 | A1 | 7/2007 | Nasser-Ghodsi et al. ....... 430/5 |
| 2007/0158304 | A1 | 7/2007 | Nasser-Ghodsi et al. ...... 216/66 |
| 2007/0158562 | A1 | 7/2007 | Nasser-Ghodsi et al. .... 250/310 |
| 2008/0088831 | A1 * | 4/2008 | Mulders et al. .......... 356/237.2 |

OTHER PUBLICATIONS

U.S. Appl. No. 60/758,818 entitled "Tungsten Plug Deposition Quality Evaluation Method by Ebace Tecnology" to Yehiel Gotkis, filed Jan. 12, 2006.

U.S. Appl. No. 60/829,636 entitled "Etch Selectivity Enhancement in Electron Beam Activated Chemical Etch" to Nasser-Ghodsi; Mehran; et al., filed Oct. 16, 2006.

U.S. Appl. No. 60/829,643 entitled "Structural Modification Using Electron Beam Activated Chemical Etch" to Nasser-Ghodsi; Mehran; et al., filed Oct. 16, 2006.

U.S. Appl. No. 60/829,659 entitled "Three-Dimensional Imagine Using Electron Beam Activated Chemical Etch" to Nasser-Ghodsi; Mehran; et al., filed Oct. 16, 2006.

U.S. Appl. No. 11/622,793 entitled "Tungsten Plug Deposition Quality Evaluation Method by Ebace Technology" to Yehiel Gotkis, filed Jan. 12, 2007.

International Search Report and Written Opinion for International Application No. PCT/US07/60503.

A. Jain et al., "Thin Solid Films" vol. 269, pp. 51-56, 1995.

Office Action dated Dec. 7, 2009 for U.S. Appl. No. 11/622,625.

Office Action dated Dec. 24, 2009 for U.S. Appl. No. 11/622,645.

Kowalksi, Ion Bombardment modification of surface morphology of Solids, 1994, Journal of Materials Science, vol. 29, pp. 3542-3552.

Asakawa et al. Chlorine Based Dry Etching og III/V Compound Semiconductors for Optoelectronics Application, Nov. 18, 1997, Japanese Journal of Applied Physics, vol. 37, pp. 373-387.

Jain et al., Thermal Dry-Etching of Copper Using Hydrogen peroxide and Hexafluroacetylacetone, Thin Solid Films 269 (1995) pp. 51-56.

* cited by examiner

THREE-DIMENSIONAL IMAGING USING ELECTRON BEAM ACTIVATED CHEMICAL ETCH

CLAIM OF PRIORITY

This application claims the benefit of priority of U.S. provisional application No. 60/758,818 entitled to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application claims the benefit of priority of U.S. provisional application No. 60/829,643 to Mehran Nasser-Ghodsi et al filed the same day as the present application and entitled, "STRUCTURAL MODIFICATION USING ELECTRON BEAM ACTIVATED CHEMICAL ETCH", the entire disclosures of which are incorporated herein by reference.

This application claims the benefit of priority of U.S. provisional application No. 60/829,636 to Mehran Nasser-Ghodsi et al filed the same day as the present application and entitled, "ETCH SELECTIVITY ENHANCEMENT IN ELECTRON BEAM ACTIVATED CHEMICAL ETCH", the entire disclosures of which are incorporated herein by reference.

This application claims the benefit of priority of U.S. provisional application No. 60/829,659 to Mehran Nasser-Ghodsi et al filed the same day as the present application and entitled, "THREE-DIMENSIONAL IMAGING USING ELECTRON BEAM ACTIVATED CHEMICAL ETCH", the entire disclosures of which are incorporated herein by reference.

CROSS REFERENCE TO RELATED APPLICATIONS

This application is related to co-pending U.S. application Ser. No. 11/622,793 to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application is also related to co-pending U.S. patent application Ser. No. 11/622,625 to Mehran Nasser-Ghodsi et al filed the same day as the present application and entitled, "STRUCTURAL MODIFICATION USING ELECTRON BEAM ACTIVATED CHEMICAL ETCH", the entire disclosures of which are incorporated herein by reference.

This application is also related to co-pending U.S. patent application Ser. No. 11/622,605 to Mehran Nasser-Ghodsi et al filed the same day as the present application and entitled, "ETCH SELECTIVITY ENHANCEMENT IN ELECTRON BEAM ACTIVATED CHEMICAL ETCH", the entire disclosures of which are incorporated herein by reference.

FIELD OF THE INVENTION

This invention generally relates to semiconductor fabrication and more particularly to electron beam activated chemical etching (eBACE).

BACKGROUND OF THE INVENTION

A technique known as electron beam activated chemical etch (EBACE) has been developed as an analytical tool in semiconductor fabrication. In this technique an etchant, typically in the form of a gas or vapor, is introduced into the field of view of a scanning electron microscope proximate the surface of a target, such as an integrated circuit device. The etchant is usually one that is known to etch the target material upon electron-beam induced activation. The electron beam from the electron microscope activates the etchant resulting in etching of the target surface in locations exposed to both the etchant and the electron beam. The target surface can be etched layer by layer with real time imaging of each layer.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

A method for 3-D image reconstruction using electron beam activated chemical etch (EBACE) is disclosed. A target or portion thereof may be exposed to a gas composition of a type that etches the target when the gas composition and/or target are exposed to an electron beam. By directing an electron beam toward the target in the vicinity of the gas composition, an interaction between the electron beam and the gas composition etches a portion of the target exposed to both the gas composition and the electron beam. De-layering etching of the target due to interaction between the electron beam and gas composition may be combined with real time imaging of each layer of structure. Those images can be retained in database for further 3-D image reconstruction of the target.

Figure 1A:
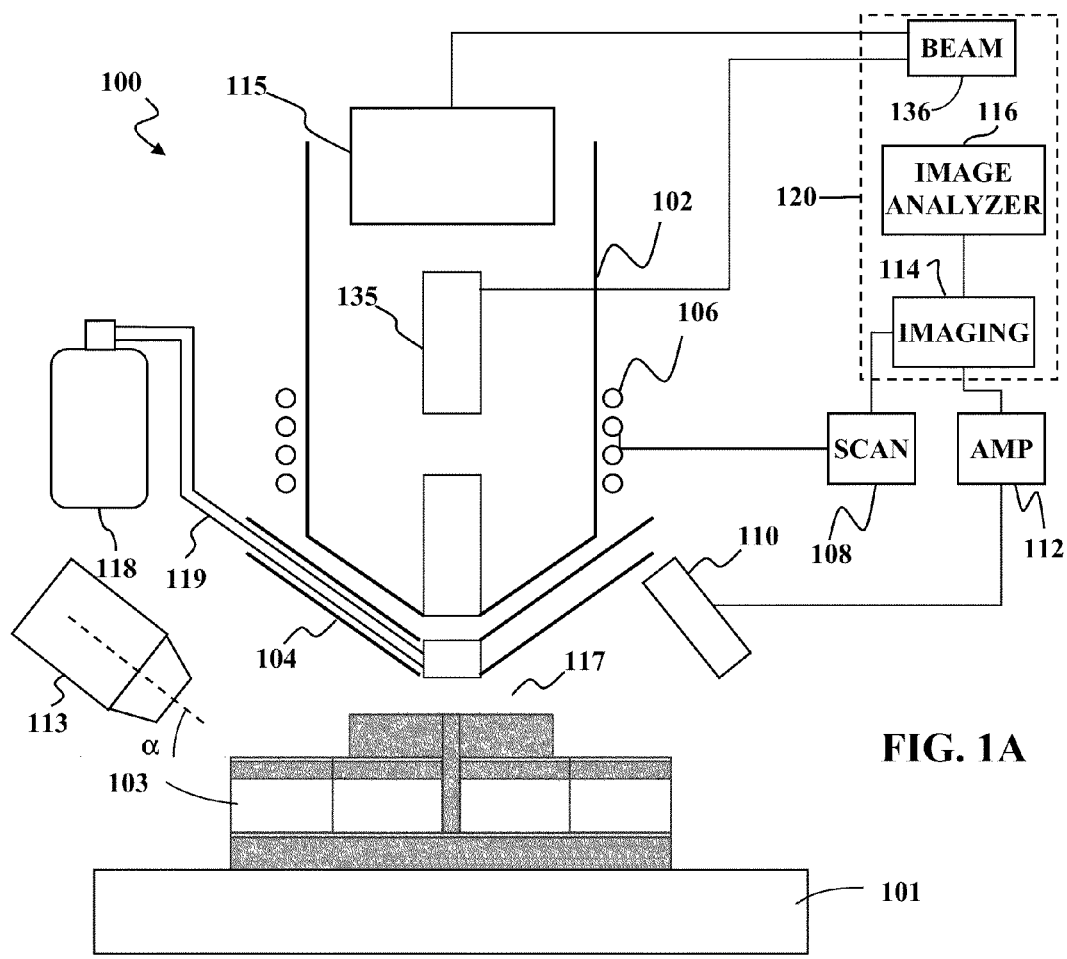
FIG. 1A is a schematic diagram of an electron beam activated chemical etch (EBACE) system adapted for structures de-layering according to an embodiment of the present invention.
Figure 1B:
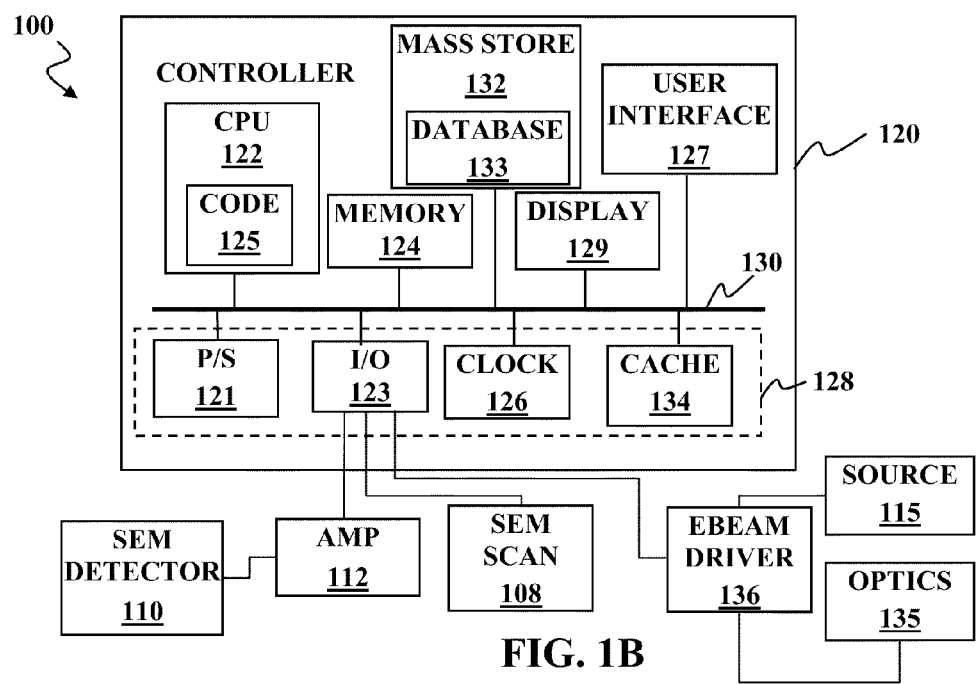
FIG. 1B is a block diagram of the system of FIG. 1A.

FIGS. 1A-1B illustrate an example of an electron beam activated chemical etch (EBACE) system 100 adapted for use with embodiments of the present invention. As shown in FIG. 1A, the system 100 generally includes a scanning electron microscope having an electron beam column 102 with an electron source 115, beam optics 135 an immersion lens 104. The electron beam column 102 may be controlled by electronics 136, referred to herein as an e-beam driver. The e-beam driver 136 may control the electron source 115, beam optics 135 and immersion lens 104.

Electrons from the electron beam column 102 are focused onto a target surface 101, which may be an integrated circuit wafer or a test wafer. The electrons are scanned across the surface of the target 101 by magnet deflecting fields provided by one or more scanning coils 106. Current is provided to the coils 106 via a scanner driver 108. Electrons striking the target 101 are either backscattered or initiate secondary emission. Either way a detector 110 generates a signal proportional to the amount of backscattering or secondary emission. The signal may be amplified by an amplifier 112. The amplified signal and a signal from the scanner driver 108 are combined by an image generator 114 to produce a high-contrast, magnified image of the surface of the target 101. The images are analyzed by an image analyzer 116.

The target 101 may optionally include one or more test structures, e.g. semiconductor devices 103.

An electron activated etching gas or vapor composition 117 is introduced from one or more remote sources 118 via a conduit 119. It is desirable to introduce the etching gas or vapor as close as possible to the point on the surface of the target 101 impacted by the electrons from the electron beam column 102. By way of example, the etching gas or vapor may be introduced between two adjacent electrodes of the immersion lens 104. The electrons activate localized etching of the target surface 101. Images of the etched surface generated by the image generator 114 may be analyzed by the image analyzer 116. The image analysis determines a measure of quality of structure 103.

In some embodiments the system 100 may optionally include a tilt column 113. The tilt column 113 is essentially a scanning electron microscope (SEM) beam column that is tilted at an angle $\alpha$ with respect to the surface of the target 101. The tilt column 113 may include an electron source, beam optics an immersion lens configured as in the beam column 102. The tilt column 113 may obtain SEM images of the target 101 at a tilted viewing angle $\alpha$.

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104 and the scanning of the electron beam by the coils 106 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135 and the detector 110 or amplifier 112 through the I/O functions 123 in response to data and program code instructions stored and retrieved by the memory 124. Depending on the configuration or selection of controller 120 the scanner driver 108 and detector 110 or amplifier 112 may interface with the I/O functions via conditioning circuits. The conditioning circuits may be implemented in hardware or software form, e.g., within code 125.

Figure 2:
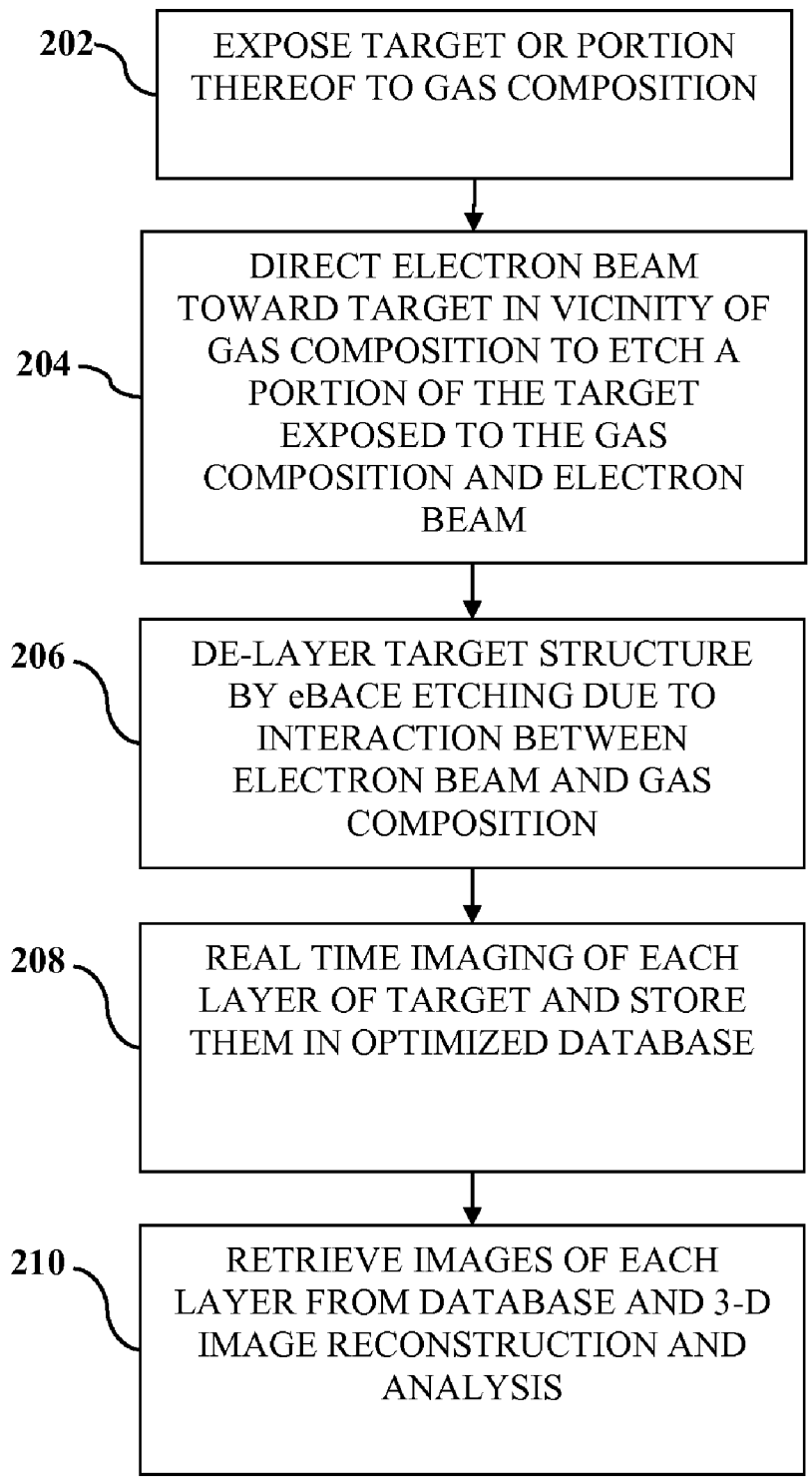
FIG. 2 is a flow diagram illustrating an example of a method for 3-D image reconstruction using eBACE according to an embodiment of the present invention.

FIG. 2 illustrates a method 200 for target de-layering using electron beam activated chemical etch (EBACE). At 202 the target structure 103 or a portion thereof is exposed to the gas composition 117. The gas composition is of a type that etches nearby portions of the target 101 when the gas composition 117 is exposed to the electron beam. At 204 the electron beam is directed toward the target 101 in the vicinity of the gas composition 117. An interaction between the electron beam and the gas composition 117 etches a portion of the target 101 exposed to both the gas composition 117 and the electron beam. At 206 the target structure 103 is de-layered by means of etching due to interaction between the electron beam and gas composition 117 is enhanced. At 208 each layer of etched target structure is imaged in real time and stored in a database 133 on mass storage device 132 or in memory 124. The database 133 may be optimized to remove replicated layers in order to save storage space without loss of structural information. At 210 images of each layer of the targeted structure 103 can be retrieved from the database 133 for 3-D image reconstruction analysis.

Figure 3A:
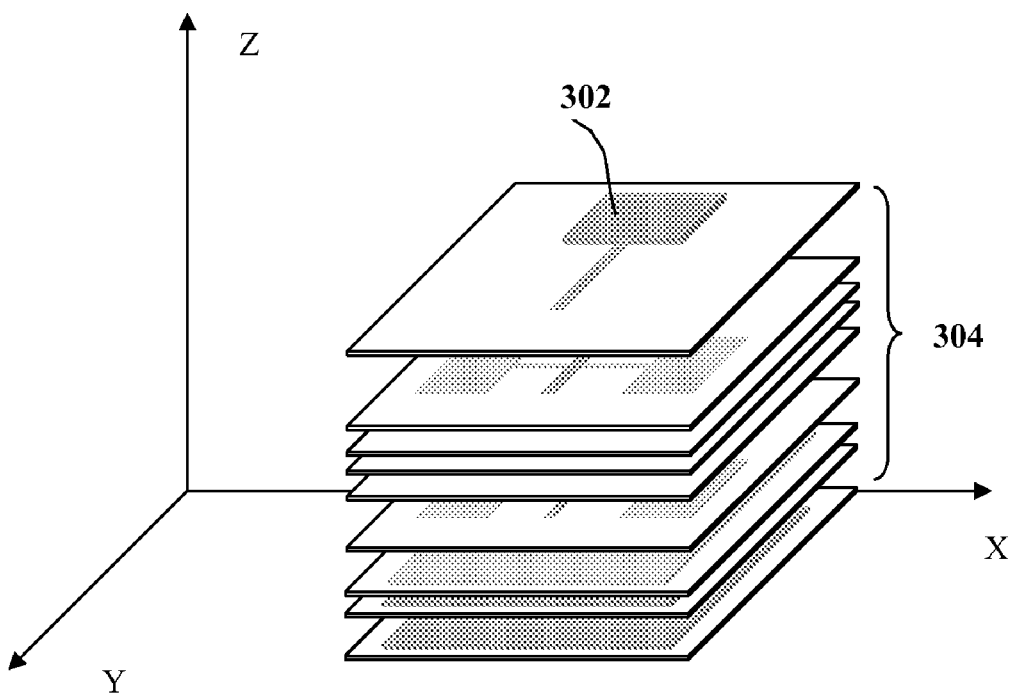
FIGS. 3A-3B illustrate a process of schematic 3-D structure reconstruction from a number of image frames obtained using eBACE according to an embodiment of the present invention.
Figure 3B:
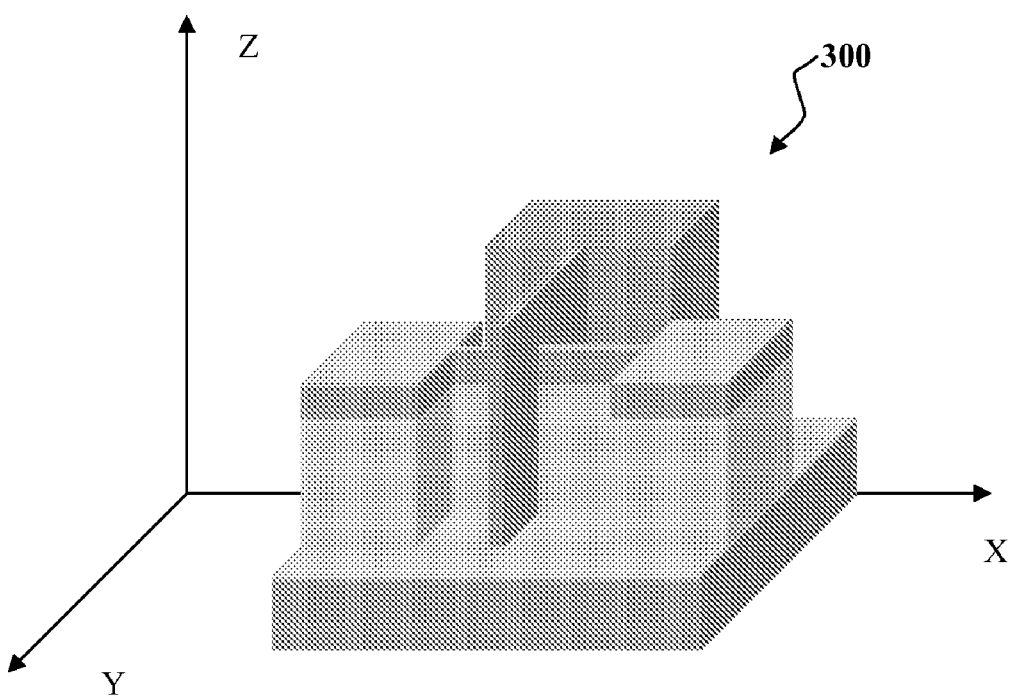

FIGS. 3A-3B, illustrate a 3-D example of 3D image reconstruction of the target structure 103 from images of different layers of the target structure 103. These images may be stored in the database 133. In this example illustrated in FIGS. 3A-3B, the target structure 103 is a portion of a semiconductor device having a double-gated fin FET structure. Images of target structure layers 302 may be stored in the database 133. The images are schematically shown in a form of frames 304. The frames 304 may be obtained sequentially at regular intervals in a top-down fashion as the eBACE process etches deeper into the target structure 103. The images may be compressed and scaled in dimensions X and Y and positioned in dimension Z so that a 3-D image 300 of target structure 103 can be reconstructed using known methods, e.g. interpolation, without loss of structural information as illustrated in FIG. 3B. For example, each frame 304 may be regarded as a 2-dimensional image of a slice or cross-section of the target structure 103 within a portion of the target substrate 101. A relative depth may be determined for each frame 304 and the 3-D image 300 may be reconstructed from the 2-D cross-sectional information in each frame and a relative depth between two or more frames. The reconstruction process may be visualized as a sequential stacking of the frames 304. The depth of each frame may be estimated from the distance between the top of the feature (imaged in a top frame) and a bottom of the feature (imaged in a bottom frame). For example, if the depth between the top and bottom of the feature is D and there are N images, the distance $\Delta D$ between adjacent images may be estimated as $\Delta D = D/N$. By way of example, the depth D may be determined from an image of the feature taken with the tilt column 113. From the image, a distance d between the top of the feature and the bottom of the feature may be measured on the image. This measurement gives the distance in the plane of the image. If the tilt angle $\alpha$ is known, the distance along the image may be converted to a depth from simple trigonometry, e.g., by dividing the measured distance d by the cosine of the tilt angle $\alpha$. Alternatively, the depth D may be estimated from a known etch rate for the eBACE process and a known time between the first (top) and last (bottom) frames. In addition, the depth D may be directly measured, e.g., using an atomic force microscope.

There are a number of commercially available software packages for obtaining the 3-D image 300 from the stack of 2-D images in the frames 304. For example, Amira software from Mercury Computer Systems Inc. of Chelmsford, Mass. may be used to generate the 3-D image from a stack of 2-D images. The obtained 3-D image 300 can be analyzed for the presence of possible random or systematic defects in the structure 103 or for other structural analysis purposes. The 3-D image 300 is also useful for making 3-D measurements, e.g., of a volume or surface area of a three-dimensional feature.

Embodiments of the present invention have certain advantages over prior art techniques for generating 3D images of buried structures. For example, one prior art 3D image technique uses a focused ion beam (FIB) system to remove layers of material. After each layer is removed, a separate imaging system (e.g., a SEM), obtains an image of the target. The 3D image is built through a sequence of FIB and imaging. Unfortunately, this process can be relatively slow, since FIB de-layering and SEM imaging cannot be done simultaneously. The slow rate of imaging makes it difficult to monitor and adjust the de-layering process. In addition, removal of target structure layers by FIB may tend to smear or damage structural features, making the resulting 3D image a less than reliable representation of the actual target structure.

Embodiments of the present invention, by contrast use the same electron beam and the same tool to do both eBACE and target imaging. As a result, images may be obtained very quickly and the progress of the etching may be monitored in real time as it happens. Furthermore, eBACE is less likely to smear or damage features of the structure 103B while obtaining the frames 304 containing images of the layers 302 of the target structure 103.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for imaging a structure, comprising:
exposing a surface of a substrate (or a portion thereof) to a gas composition, wherein the gas composition includes one or more components that etch the substrate upon activation by interaction with a beam of electrons;
directing a beam of electrons to one or more portions of the surface of the substrate that are exposed to the gas composition to etch the one or more portions;
obtaining a plurality of images of the one or more portions at different instances of time as the one or more portions are etched;
measuring a relative depth between at least two images of the plurality of images; and
generating from the plurality of images and relative depth a three-dimensional model of one or more structures embedded within the one or more portions of the substrate.

2. The method of claim 1 wherein obtaining the plurality of images includes detecting secondary electrons generated from an interaction between the beam of electrons and the one or more portions.

3. The method of claim 1 wherein obtaining the plurality of images includes using a scanning electron microscope to detect secondary electrons generated from an interaction between the beam of electrons and the one or more portions.

4. The method of claim 1 wherein directing a beam of electrons to one or more portions of the surface includes using a scanning electron microscope to direct the beam of electrons to the one or more portions of the surface.

5. The method of claim 4 wherein obtaining the plurality of images includes using a scanning electron microscope to detect secondary electrons generated from an interaction between the beam of electrons and the one or more portions.

6. The method of claim 1 wherein directing a beam of electrons to one or more portions of the surface of the substrate and obtaining the plurality of images take place substantially simultaneously.

7. The method of claim 6 wherein directing a beam of electrons to one or more portions of the surface includes using a scanning electron microscope to direct the beam of electrons to the one or more portions of the surface.

8. The method of claim 7 wherein obtaining the plurality of images includes using a scanning electron microscope to detect secondary electrons generated from an interaction between the beam of electrons and the one or more portions.

9. The method of claim 1 wherein obtaining the plurality of images includes obtaining the images sequentially at regular intervals in a top-down fashion as the interaction between the electron beam and the gas composition etches deeper into the substrate.

10. The method of claim 1, further comprising storing the plurality of images in a database.

11. The method of claim 10 wherein generating from the plurality of images a three-dimensional model of one or more structures embedded within the one or more portions of the substrate includes retrieving images from the database and constructing the three-dimensional model from the images retrieved from the database.

12. The method of claim 1 wherein measuring the relative depth includes obtaining a tilted SEM image of one or more portions of top and bottom frames of the plurality of images at a tilted viewing angle relative to a viewing direction of the plurality of images;
measuring a distance d between a top of a feature in the top frame and a bottom of the feature in the bottom frame on the tilted SEM image using a scanning electron microscope that is separate from a beam column that delivers the beam of electrons; and
determining the relative depth from the distance d and the tilted viewing angle.

13. An apparatus for imaging a structure, comprising:
a source of a gas composition adapted to expose a surface of a substrate (or a portion thereof) to the gas composition, wherein the gas composition includes one or more components that etch the substrate upon activation by interaction with a beam of electrons;
a source of electrons adapted to deliver a beam of electrons to one or more portions of the surface of the substrate that are exposed to the gas composition to etch the one or more portions;

an imaging system adapted to obtain a plurality of images of the one or more portions at different instances of time as the one or more portions are etched;

means for measuring a relative depth between at least two images of the plurality of images; and a processor coupled to the imaging system, the processor adapted to execute one or more processor readable instructions that, when executed, generate from the plurality of images and the relative depth a three-dimensional model of one or more structures embedded within the one or more portions of the substrate.

14. The apparatus of claim 13 wherein the imaging system includes a secondary electron detector adapted to detect secondary electrons generated from an interaction between the beam of electrons and the one or more portions.

15. The apparatus of claim 13 wherein the imaging system includes a scanning electron microscope adapted to detect secondary electrons generated from an interaction between the beam of electrons and the one or more portions.

16. The apparatus of claim 13 wherein the source of electrons includes an electron beam column of a scanning electron microscope.

17. The apparatus of claim 16 wherein the imaging system includes a secondary electron detector of the scanning electron microscope.

18. The apparatus of claim 13 further comprising a memory operably coupled to the processor, wherein the processor and memory are adapted to store the plurality of images in a database.

19. The apparatus of claim 13 wherein the means for measuring a relative depth between at least two images of the plurality of images system includes a scanning electron microscope tilted at an angle with respect to a viewing direction of the plurality of images, wherein the scanning electron microscope is separate from a beam column that delivers the beam of electrons.

20. A processor-readable medium having embodied therein processor readable instructions to be executed on a processor coupled to a gas source adapted to expose a surface of a substrate (or a portion thereof) to the gas composition, a source of electrons adapted to deliver a beam of electrons to one or more portions of the surface of the substrate that are exposed to the gas composition and an imaging system adapted to obtain a plurality of images of the one or more portions at different instances of time, a processor coupled to the imaging system;

the processor readable instructions including one or more instructions that, when executed on the processor, cause the gas source to expose a surface of a substrate (or a portion thereof) to a gas composition from the gas source, wherein the gas composition includes one or more components that etch the substrate upon activation by interaction with a beam of electrons;

the processor readable instructions including one or more instructions that, when executed on the processor, cause the source of electrons to direct a beam of electrons to one or more portions of the surface of the substrate that are exposed to the gas composition to etch the one or more portions;

the processor readable instructions including one or more instructions that, when executed on the processor, cause the imaging system to obtain a plurality of images of the one or more portions at different instances of time as the one or more portions are etched;

the processor readable instructions including one or more instructions that, when executed on the processor, measure a relative depth between at least two images of the plurality of images;

the processor readable instructions including one or more instructions that, when executed on the processor, generate from the plurality of images and the relative depth a three-dimensional model of one or more structures embedded within the one or more portions of the substrate.

21. The processor-readable medium of claim 20, wherein the relative depth of each top view image is measured by obtaining a tilted SEM image of one or more portions of top and bottom frames of the plurality of images obtained at a tilted viewing angle relative to a viewing direction of the plurality of images using a scanning electron microscope that is separate from a beam column that delivers the beam of electrons;

measuring a distance d between a top of a feature in the top frame and a bottom of the feature in the bottom frame on the tilted SEM image; and determining the relative depth from the distance d and the tilted viewing angle.

* * * * *